United States Patent
deVos et al.

(10) Patent No.: US 10,010,902 B2
(45) Date of Patent: Jul. 3, 2018

(54) THIN-FILM COATING APPARATUS FOR APPLYING ENHANCED PERFORMANCE COATINGS ON OUTDOOR SUBSTRATES

(71) Applicants: John Arthur deVos, Corvallis, OR (US); Adam J. Gage, Corvallis, OR (US)

(72) Inventors: John Arthur deVos, Corvallis, OR (US); Adam J. Gage, Corvallis, OR (US)

( * ) Notice: Subject to any disclaimer, the term of this patent is extended or adjusted under 35 U.S.C. 154(b) by 0 days.

(21) Appl. No.: 15/276,726

(22) Filed: Sep. 26, 2016

(65) Prior Publication Data
US 2017/0008022 A1   Jan. 12, 2017

Related U.S. Application Data

(63) Continuation-in-part of application No. PCT/IB2015/001531, filed on Mar. 25, 2015.
(Continued)

(51) Int. Cl.
| | |
|---|---|
| *B05C 1/06* | (2006.01) |
| *B05C 11/00* | (2006.01) |
| *B05B 9/06* | (2006.01) |
| *H01L 31/0216* | (2014.01) |
| *B05C 1/08* | (2006.01) |

(Continued)

(52) U.S. Cl.
CPC ............ *B05C 1/08* (2013.01); *B05B 3/00* (2013.01); *B05B 13/005* (2013.01); *B05C 1/06* (2013.01); *B05C 5/0258* (2013.01); *B05C 13/02* (2013.01); *B05C 17/10* (2013.01); *B05D 1/02* (2013.01); *C03C 17/001* (2013.01); *C08K 3/36* (2013.01); *C08K 5/5415* (2013.01); *C09D 1/02* (2013.01); *C09D 5/00* (2013.01); *C09D 5/006* (2013.01); *G02B 1/111* (2013.01); *G02B 1/113* (2013.01); *G02B 1/115* (2013.01); *H01L 31/02168* (2013.01); *H01L 31/18* (2013.01); *H02S 40/22* (2014.12); *H02S 50/10* (2014.12); *B05B 9/06* (2013.01); *B05C 17/0341* (2013.01); *B82Y 20/00* (2013.01)

(58) Field of Classification Search
None
See application file for complete search history.

(56) References Cited

U.S. PATENT DOCUMENTS 3,732,016 A * 5/1973 Deshayes ........... G01B 11/0625
                                                    250/559.27
4,537,522 A * 8/1985 Charney ................ B05C 17/02
                                                    401/146
(Continued)

*Primary Examiner* — Binu Thomas

(57) ABSTRACT

A thin-film coating applicator assembly is disclosed for coating substrates in outdoor applications. The innovative thin-film coating applicator assembly is adapted to apply performance enhancement coatings on installed photovoltaic panels and glass windows in outdoor environments. The coating applicator is adapted to move along a solar panel or glass pane while applicator mechanisms deposit a uniform layer of liquid coating solution to the substrate's surface. The applicator assembly comprises a conveyance means disposed on a frame. Further disclosed are innovative applicator heads that comprise a deformable sponge-like core surrounded by a microporous layer. The structure, when in contact with a substrate surface, deposits a uniform layer of coating solution over a large surface.

38 Claims, 10 Drawing Sheets

Related U.S. Application Data

(60) Provisional application No. 61/969,842, filed on Mar. 25, 2014.

(51) Int. Cl.

| | | |
|---|---|---|
| *B05B 13/00* | (2006.01) | |
| *C08K 3/36* | (2006.01) | |
| *C08K 5/5415* | (2006.01) | |
| *C09D 5/00* | (2006.01) | |
| *G02B 1/113* | (2015.01) | |
| *G02B 1/115* | (2015.01) | |
| *G02B 1/111* | (2015.01) | |
| *B05B 3/00* | (2006.01) | |
| *B05D 1/02* | (2006.01) | |
| *C03C 17/00* | (2006.01) | |
| *C09D 1/02* | (2006.01) | |
| *H02S 40/22* | (2014.01) | |
| *H02S 50/10* | (2014.01) | |
| *B05C 13/02* | (2006.01) | |
| *H01L 31/18* | (2006.01) | |
| *B05C 5/02* | (2006.01) | |
| *B05C 17/10* | (2006.01) | |
| *B82Y 20/00* | (2011.01) | |
| *B05C 17/03* | (2006.01) | |

(56) References Cited

U.S. PATENT DOCUMENTS

| | | | | |
|---|---|---|---|---|
| 6,383,290 | B1 * | 5/2002 | Davis | B24B 7/188 118/207 |
| 6,524,386 | B1 * | 2/2003 | Slager, Sr. | A47L 11/03 118/207 |
| 2006/0278161 | A1 * | 12/2006 | Burkholder | B05B 13/02 118/323 |
| 2009/0266353 | A1 * | 10/2009 | Lee | B08B 1/008 126/593 |
| 2010/0000570 | A1 * | 1/2010 | Mertins | B08B 1/008 134/6 |
| 2010/0212093 | A1 * | 8/2010 | Pak | F24J 2/40 15/97.1 |
| 2011/0186077 | A1 * | 8/2011 | Thompson | B08B 7/00 134/6 |
| 2012/0125367 | A1 * | 5/2012 | Monkman | B08B 1/04 134/18 |
| 2013/0122186 | A1 * | 5/2013 | Hoppel | B05B 12/12 118/323 |
| 2015/0207021 | A1 * | 7/2015 | Williams | H02S 40/00 521/59 |

* cited by examiner

THIN-FILM COATING APPARATUS FOR APPLYING ENHANCED PERFORMANCE COATINGS ON OUTDOOR SUBSTRATES

CROSS REFERENCE TO PRIORITY APPLICATIONS

This non-provisional utility application is filed as a Continuation-in-Part (C-I-P) of PCT Application No. PCT/US15/22593 filed on Mar. 25, 2015, of which the 30 month international pendency ends on Sep. 25, 2016. This C-I-P is filed under the provisions of 35 U.S.C. sections 111(a) and 120 in lieu of a 35 U.S.C. 371(c) national phase of the aforementioned PCT application. The aforementioned PCT application designates the United States, and claims the benefit of U.S. Provisional Application No. 61/969,842, filed on Mar. 25, 2014 under the provisions of 35 U.S.C. 119(e).

FIELD OF THE TECHNOLOGY

The instant innovation relates to coating devices and apparatuses, in particular for providing high-quality performance enhancement coatings, including, but not limited to anti-reflective coatings on installed photovoltaic panels, glass windows and similar substrates directly in the field.

BACKGROUND

Silicon photovoltaic panels typically have a protective top layer of cover glass or plastic to protect the underlying photovoltaic cells. Enhanced performance coatings such as thin-film energy transmission improvement layers in the form of antireflective coatings on the top surface of the cover glass or plastic protective layer is desirable from the standpoint of increasing solar cell efficiency. Such films improve the transmission of infrared, visible and ultraviolet wavelengths of light through the cover glass or plastic protective layer, typically by providing a refractive index gradient to better capture incident light energy that otherwise would be reflected from the surface of the cover glass or plastic protective layer. Enhanced transmission of light energy to photovoltaic cells provides an advantage by increasing the number of photons available for electricity production. Energy transmission improvement coatings, again in the form of antireflective coatings, may also provide an advantage for glass windows by reducing the light reflected off of the surface, reducing the glare normally emanating from glass surfaces. Increased energy transmission, in the form of increasing the number of photons transmitted through the glass from outside a building to the inside of the building, may also reduce the need for interior electric lighting. Both photovoltaic panel cover glass and window glass are typically large and require even coatings of uniform thickness to be effective.

Thin film coating technologies have been developed and perfected for industrial scale production in window and solar panel manufacturing. As it has become known that thin-film antireflective coatings improve solar cell efficiencies, it has become desirable to now manufacture solar photovoltaic panels with such coatings in recent years. However, retro-fitting older panels not originally coated with antireflective coatings requires dismantling of the photovoltaic array and sending the individual panels to a factory or facility for coating, an expensive and disruptive endeavor. Similarly for glass window panes installed on commercial buildings and storefronts, many may benefit from an antiglare coating, but are already installed and would need to be replaced with new pre-coated window panes, or by installing anti-glare sheets on the pane. Currently, there are no viable, cost effective solutions for retrofitting photovoltaic panels and window panes with high quality thin-film coatings.

SUMMARY

The innovation described herein is a novel portable coating apparatus for applying performance enhancement coatings to the surfaces of utilitarian substrates such as photovoltaic (solar) panels, glass windows, and the like, used outdoors or inside buildings. Embodiments of the innovative coating apparatus comprise manually controlled and autonomous portable coating assemblies, wherein the entire assembly, or a portion thereof, is adapted to travel, translate, or otherwise be conveyed along a substrate surface while spreading an even and uniform layer of a liquid coating solution, which then cures to form a solid coating layer. The coating may be an optical coating, as, for example, an anti-reflective coating, advantageous for increasing efficiencies of photovoltaic panels and solar thermal panels, or reducing glare from glass window panes.

It is a primary object of the innovation described herein to provide a facile means of applying coatings of field installations of substrates post-manufacture, as, for example, an array of photovoltaic panels installed outdoors at a power generation facility, an array of solar thermal panels installed on a building roof or in another outdoor location, and the like. As coatings such as anti-reflective coatings are proven to increase efficiencies of photovoltaic panels in particular and have begun to gain wide acceptance in recent years, it may be advantageous to retrofit older panels already deployed in installations with such coatings; however, present coating systems are stationary apparatuses for use in a manufacturing facility, for example, and the current post-manufacture coating protocol requires the dismantling of a photovoltaic (or other) array and sending the panels to a facility to have the coating done. This is obviously expensive and disruptive, where the costs of going this route may outweigh the efficiencies gained by the coating, at least in the short term. The instant innovation provides a desirable solution to this dilemma, whereby a portable coating system is provided having the ability to traverse the surface of a panel substrate and deposit a high-quality coating across the entire surface of the substrate. By high quality, it is understood that the films deposited by the instant innovation are substantially uniform in thickness across the substrate.

To achieve such uniformity in coating thickness, the instant innovation is adapted to be placed on or over a panel substrate, and then to cause the coating mechanism to traverse the panel while spreading the coating solution at a substantially constant deposited volume per panel substrate unit area. For some coating applications, some embodiments of the instant innovation may comprise a portable coating assembly adapted for coating installed panel substrates of the type described above, wherein the portable coating assembly comprises a support structure having dimensions that are compatible with panel dimensions (e.g., the width of the support structure is compatible with the width of the panel). Some portable coating assembly embodiments may further comprise one or more coating applicator mechanisms or structures and a conveyance mechanism that is adapted to move the one or more coating applicator mechanisms along their trajectory on the surface of the panel substrate.

The inventive portable coating assembly further comprises one or more innovative coating applicator mechanisms affixed to the support structure. In some embodiments, the support structure may take the form of a platform. The coating applicator mechanisms comprise a means to deposit the coating solution on the surface of the substrate, said means including, but not limited to spray heads, rollers, slots, brushes, doctor blades, wipers, draw-bars, sponges, foam, porous textile layer or a combination of such.

In some embodiments, the coating applicator mechanisms comprise one or more applicator heads, each of which further comprises a deformable core body, composed of a compliant and deformable material, and a microporous "skin", or interface layer having a certain micropore volume sufficient to hold a determined amount of liquid coating solution and contacting a portion of the surface of the deformable core body. The deformable core body may also be porous in nature and serve the function of an additional reservoir for a liquid coating solution, and the microporous layer serves the function of an interface between the deformable core body and the substrate surface, whereby the micropores act as a capillary array to transfer coating solution to the substrate. In some embodiments, a textile such as a felt fabric may be used as the microporous interface layer. Felt fabrics have a large plurality of fibers oriented randomly within the fabric, where the interstitial spaces between the fibers present an extensive array of tortuous micropores.

Moreover, felts can be fabricated from a large variety of fibers to virtually any thickness, and have very fine and soft textures ideal for uniform spreading of liquids on surfaces. The soft and compliant nature of felts make them ideal for use as a microporous interface layer. In addition to felts, other fabrics and materials may be used for the same purpose (e.g. woven sheet and high porosity foam). The micropores of the felt interface or an interface created by other materials effectively act as an array of capillaries that store and transfer liquid coating solution to the surface in a manner that is substantially uniform over the contact surface of the applicator head or other suitable coating mechanism. As coating solution is depleted in the microporous interface layer, in one embodiment where the deformable core is also porous and contains coating solution, the microporous interface layer may draw coating solution from the deformable core and transfer it to the substrate surface. In another embodiment, coating solution may be pumped from a reservoir through one or more tubes to the microporous interface layer before or during the coating process.

The instant innovation includes manually guided and automated embodiments, and combinations thereof. Manually guided embodiments of the instant innovation comprise the support structure and coating mechanism assembly discussed above, further comprising a handle extension of the support structure that may be rigid or bendable, where the latter may comprise springs in the handle to compensate for variations in hand-applied pressure, which can lead to non-uniformities in coating thickness. Handles may also be pivotally attached to the inventive portable coating assembly, providing ergonomic deployment of the invention. Automated embodiments may comprise mechanized or robotic coating assembly versions, whereby the support structure and coating mechanism assembly may further comprise a conveyance mechanism comprising a motorized drive.

An example of this type of embodiment is an electric motor affixed to the support structure, and coupled to a roller axel via a chain, belt or a gear train, whereby the roller axle may be connected to wheels or other devices to convey the coating assembly across the substrate. The electric motor may be controlled by an electronic motor control circuit in some embodiments. In other embodiments, the electronic motor control circuit programmable, and in yet further embodiments may also be capable of wireless control and programming. As an example, the motor serves the function of driving the innovative portable coating assembly at a constant speed to enable deposition of coatings having substantially uniform thicknesses in one embodiment. As a further example, if a thickness gradient is desired across the substrate, the motor can be programmed to ramp the speed of the assembly in another embodiment. In a still further embodiment, a ramped or variable speed may also be desired for maintaining a substantially uniform coating thickness in possible embodiments where the coating solution flow rate is also ramped or variable.

In automated embodiments, the electronic motor control circuit may also receive input from sensors that measure parameters that may correlate with the motor speed necessary to maintain a substantially uniform thickness. Such measured parameters may include ambient temperature, ambient humidity, or amount of light reflection from the coated surface. The electronic motor control circuit may then use these measured parameters to adjust the motor speed. In this way, a substantially uniform coating thickness may be maintained even if the measured parameters may change over time.

In some embodiments, the effective width of the support structure is sufficient to span the width of a panel substrate, requiring only a single excursion of the innovative portable coating assembly in one direction along the length of the substrate to deposit the coating, simplifying the coating process. In other embodiments, a motorized drive mechanism may translate the coating applicator mechanism both lengthwise and widthwise across the substrate in a grid fashion or other motion, for example, when coating areas are wider than the width of the support structure. In other embodiments, the effective width of the support structure is adjustable to span the width of substrates of non-standardized widths. Related to this aspect, manual, partially automated or fully automated embodiments may include an elongated handle for manual placement and removal of the innovative portable coating assembly on a substrate. The elongated handle provides extended reach, and as such may have ergonomic value.

Moreover, the handle may be pivotally affixed to the support structure, providing further ergonomic value. In other embodiments, the support structure may be positioned on to or translated across the substrate by a robotic arm. In yet other embodiments, the support structure may be autonomously translated across the substrate by an on-board motor without the use of a handle or robotic arm to guide it. In yet other embodiments, a combination between manually guided and automated functions may include a handle whereby the operator may help control any motion in an axis orthogonal to the direction of coating while the automated motorized functions may guide the portable coating assembly in the direction of coating. In yet further embodiments, a cabled translation mechanism may be employed.

It is a further objective of the innovation to provide coatings of uniform thickness. For embodiments comprising one or more coating heads, each of which further comprises a deformable core body, the degree of deformation may be a function of the weight of the entire assembly supported by the coating heads when engaged with the surface to be coated, as well as other vertical forces imposed on the innovative assembly. The weight of the portable coating assembly may also be supported in part by the conveyance mechanism. The deformation may furthermore pressurize any liquid contained within the microporous interface layer, and if a porous deformable core body is used, any liquid contained within the porous deformable core body as well, increasing the flux of the liquid when discharged to the substrate surface during the coating process.

While the weight of the portable coating assembly may remain substantially constant during the coating process, fluctuations in vertical forces, for instance, those due to changes in hand or arm pressure fluctuations that may occur when the portable coating assembly is manually guided during the excursion in manual embodiments, may cause fluctuations in deposition rate of the coating. Therefore, random variations in coating thickness result, if measures are not taken to mitigate these fluctuations. In some embodiments, coating mechanisms may be attached to the support structure by force-absorbing strut members responsive to changes in vertical force, mitigating them to various extents. In one type of embodiment, the struts are in the form of leaf springs. In other embodiments, struts comprise spring-loaded articulating joints interposed between elongated members, rigid or non-rigid. In yet further embodiments, struts may be in the form of a shock-absorbing dashpot mechanism, or simple compression springs.

The spring constants, or stiffness, of the various types of strut spring components may be chosen to cause the spring to deform sufficiently in response to the magnitude of changes in applied force. The struts then may absorb or at least partially absorb force fluctuations or redistribute and mitigate these force fluctuations over time before these are transferred to the deformable porous core bodies of the coating mechanisms, causing fluctuations in the geometry and therefore the pressure on the liquid contained within. As mentioned above, these changes translate to variations in the flux of coating solution being discharged from the porous core or the microporous interface layer, ultimately resulting in variations in coating film thickness.

In the embodiments described in the preceding paragraph, the force-absorbing struts connect the coating heads to the support structure. In alternative embodiments, struts may connect the conveyance device to the support structure, whereas the coating mechanisms may be either suspended by more rigid members, or again connected by force-absorbing members. In other embodiments, the coating mechanisms may be connected to the support structure by means of hinged brackets or slides which minimize the transfer of vertical forces from the support structure to the coating heads during the coating process.

In some embodiments, coating solution may be charged to the one or more coating heads in a continuous or discontinuous manner, for instance by an on-board pumping system, and in other embodiments, the coating heads are charged continuously or discontinuously by an offline means. Reducing complexity, weight and expense of the innovative portable coating assembly, offline transfer of coating solution to the coating head or heads is a preferable solution, whereby the pumping system and coating solution reservoir is eliminated from the assembly. To this end, a separate charging or re-filling station may be provided. In one embodiment, a charging station comprises a frame or superstructure, a dosing platform, a receiving structure to place the innovative portable coating assembly, whereby the receiving structure is adapted to position the coating heads of the innovative portable coating assembly on the dosing platform. Other methods of charging the coating heads are embodied by continuous and intermittent on-board or off-board pumping systems.

In addition to anti-reflective coatings, this invention may be used to deposit other performance enhancement coatings, including wave-length shifting coatings and filter coatings such as "Low-E" coatings that minimize the transmission of either ultraviolet light or infrared light or both. In other embodiments, the performance enhancement coating may be a multi-functional coating, providing a combination of two or more functions, including, but not limited to anti-reflection, wave-length shifting, filtering of ultraviolet or infrared or both, anti-soiling, self-cleaning or thermal energy management.

DETAILED DESCRIPTION

Figure 1:
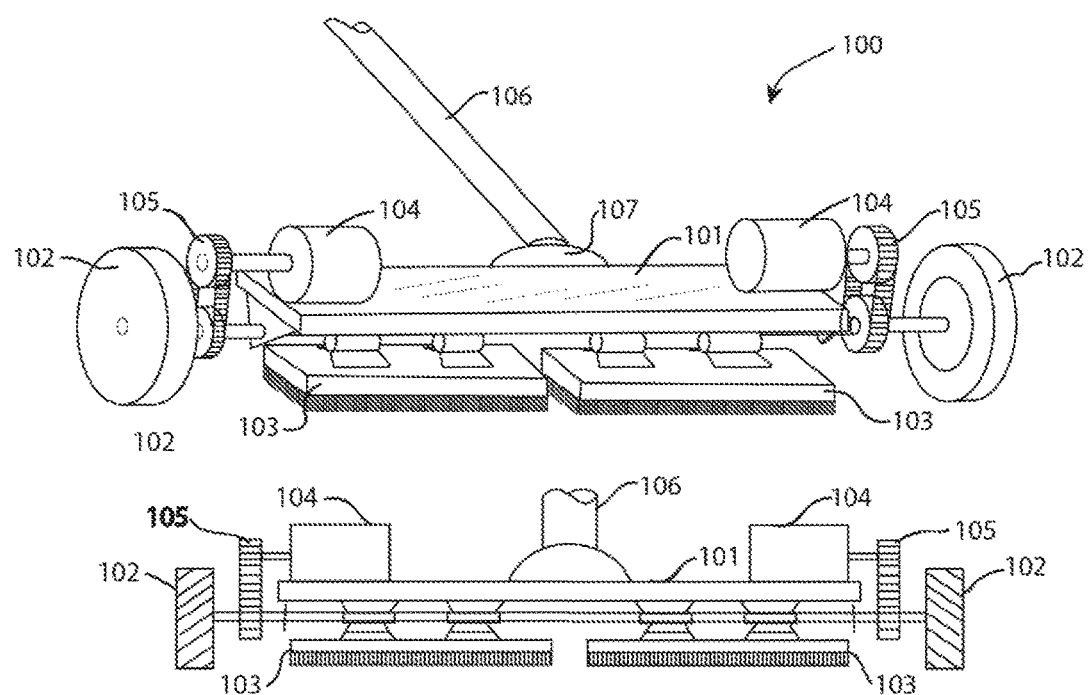
FIG. 1. View of a possible embodiment of the portable coating assembly. Oblique view and frontal view shown.

The inventive portable coating assembly system 100 in a particular embodiment is shown in FIG. 1. Assembly 100 comprises a support structure, chassis or carriage unit 101. Support structure or carriage 101 incorporates a conveyance device, which may comprise rollers or wheels 102, as shown in FIG. 1, but may equally comprise caterpillar tracks. Portable coating assembly further comprises one or more coating applicator heads 103. Two such coating heads 103 are shown in FIG. 1 attached to the underside of carriage 101 so that the assembly may be deployed on the surface of a substrate, and to engage the coating heads on the surface with the object of delivering a flux of liquid precursor coating solution to produce a coating layer having a substantially uniform thickness on the substrate surface.

Preferably, the innovative portable coating assembly includes a motorized drive, such as motor 104 coupled to the conveyance system 102 via drive train 105 to allow the portable coating assembly 100 to undergo powered excursions. The function of motor 104 in this embodiment is to drive portable coating assembly 100 at constant and uniform speed along the substrate surface while coating heads 103 are engaged with the surface. The coating heads 103 are furthermore adapted to deliver a substantially constant and uniform flow rate of coating solution to the substrate surface so long as the coating heads contact the surface with a substantially constant force and sweep along at a substantially constant speed.

Still referring to FIG. 1, elongate handle 106 is attached to support structure 101 via rotatable coupling 107. Coupling 107 may be a ball joint to allow rotation in any direction. Elongate handle 106 serves to allow manual manipulation of portable coating assembly 100, for instance, allowing an operator to pick and place assembly 100 on a substrate surface, maneuver or transport portable coating assembly by hand.

Figure 2:
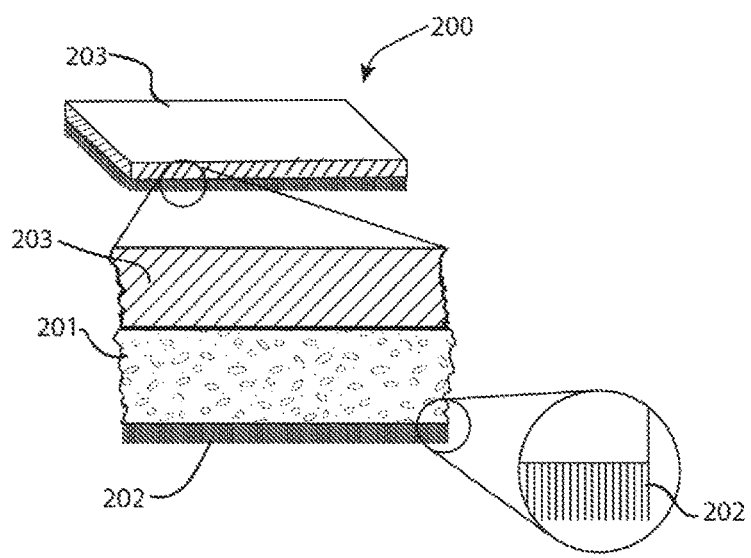
FIG. 2. Detailed view of coating applicator mechanism construction, showing the deformable core and capillary interface layer arrangement.

The innovative portable coating assembly may comprise one more coating heads. For the purposes of illustration, the following description will be focused on a single coating head. Referring to FIG. 2, applicator head 200 comprises a deformable supporting body and a microporous capillary superficial layer that covers the deformable supporting body. Coating solution may be delivered from a reservoir to the superficial capillary layer by means of a pump in fluidic communication with the capillary layer through one or more tubes or channels. Alternatively, coating solution may be delivered from a reservoir to the superficial capillary layer by means of a service station which saturates the capillary layer prior to coating. Preferably, the deformable support body comprises a porous sponge like structure, which can function as a mechanical support of the capillary layer and as a reservoir of fluid coating solution as well. The capillary layer serves as a coating interface that is in contact with a substrate surface, where liquid deposited thereupon may continually draw liquid coating solution from the capillary layer as the coating head is swept along the substrate surface. As indicated above, it is an object of the innovation to provide a uniform coating.

By the method of coating solution delivery exploited in this innovation, uniformity of coating may depend on vertical forces applied to the deformable support body or bodies, resulting in static pressure of the liquid coating solution contained within, the porosity of the capillary layer, and on the sweep speed of the coating heads. Variations in pressure liquid coating solution retained in the deformable support body would lead to variations in flow rate, thereby delivering the coating fluid in a non-uniform manner. These variations in pressure would in practice primarily be due to variations or fluctuations in vertical forces applied to the innovative portable coating assembly. Such variations may be due to manual handling of the apparatus, for example by an operator manually sweeping the portable coating assembly, a method prone to fluctuations in vertical forces applied to the portable coating assembly as it is moved across a substrate by means of an extended handle. In a robotic mode, fluctuations in vertical forces may also occur due to, for example, steadily decreasing weight of the assembly from consumption of coating solution stored in the coating heads, or by inadvertent shocks to the portable coating assembly during deployment. Advantageously, the innovation circumvents this problem by providing means to compensate for any fluctuations in vertical forces.

Coating Head Construction

Figure 3A:
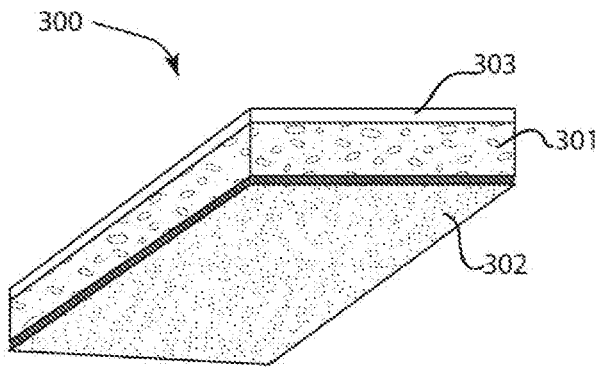
FIG. 3a. Bottom oblique view of deformable core of coating applicator mechanism.

As mentioned above, the coating mechanisms in at least one embodiment comprise at least a deformable core covered by a capillary interface layer. Exemplary details of such a structure are shown in FIG. 3a, shown in oblique view. Deformable core 301 is in the form of a spongy polymeric or rubber solid foam that preferably is mechanically compliant. In addition, the deformable core may be abundantly porous to perform the function of a reservoir for the liquid coating solution. The degree of compliance exhibited by the deformable core may be chosen to support at least a portion of the weight of the portable coating assembly without excessive deformation. Thus the material may be chosen to withstand a predetermined weight for a given degree of deformation.

Alternatively, the weight of the portable coating assembly may be supported entirely or in part by auxiliary struts or by the conveyance device, such as rollers, directly, reducing the stiffness required of the deformable body. As shown in FIG. 3a, the capillary interface 302 may be in intimate contact with the bottom surface of deformable core 301, where, for example, the bottom surface of deformable core 301 may be laminated to the capillary interface 302. Capillary interface 302 may comprise a felt-like textile or a microporous fabric or porous polymer foam sheet that provides a large array of capillaries or micropores that extend through the thickness of the capillary layer, forming a substantial porosity in the fabric. The capillary interface can also be constructed from sheets of filter media made from fibrous or extruded polymer filter sheet. In the case where the deformable core 301 is a porous material acting as a fluid reservoir, capillary interface 302 may provide a means to draw out a liquid coating solution contained within deformable core 301 by capillary action in addition to static pressure within the body of the deformable core. Capillary interface 302 also provides a means to evenly and smoothly spread the flux of coating solution to form a coating layer along the trajectory path of the inventive portable coating assembly. The thickness of the coating layer is substantially a product of the flow rate of the coating solution depositing from the capillary layer 302, and the velocity of the inventive portable coating assembly. In some embodiments, the more rapid motion of the portable coating assembly over the substrate results in more solution being deposited per unit area. Conversely, slower motion of the portable coating assembly over the substrate results in less solution being deposited per unit area.

Figure 3B:
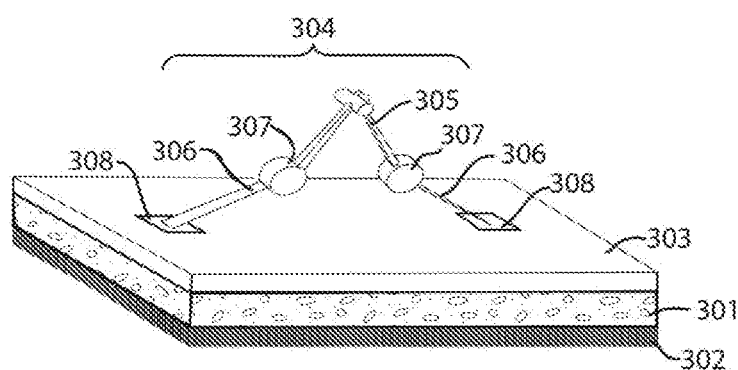
FIG. 3b. Top oblique view of coating applicator mechanism assembly, showing lever spring struts disposed for attachment to support structure.

An example of a more complete structure is shown in FIG. 3b, where a support structure or frame 303 is included, to which the deformable core 301 may be affixed by a variety of means. Frame 303 itself may exhibit a degree of compliance in order to conform to gentle contours that may be present in the substrate, and therefore may be constructed from various metals and plastics. As an example, a solar panel may not be entirely flat, but may exhibit some degree of curvature or bowing from one edge to the opposite edge. To obtain a complete coating, the coating head is configured to be able to follow this contour. For this to be possible, frame 303 is preferably made to bend or bow to conform to surface non-planarities, so a flexible structure is preferable.

Frame 303 may further provide attachment points for struts (as described above) or other connecting means to affix or suspend the coating head to the support structure. In FIG. 3b, struts 304 are shown in the form of spring-loaded hinged lever mechanism 304. The structure 304 comprises at least two struts constructed by rigid elongated structures 305 and 306, connected together by spring-loaded joint 307. The spring constant of joint 307 may be adjusted in such a way that the spring deforms to an extent under the weight of the portable coating assembly structure, but will react to sudden fluctuations in vertical force, absorbing that force fluctuation, and restoring the deformation of the spring to its initial steady state.

Figure 3C:
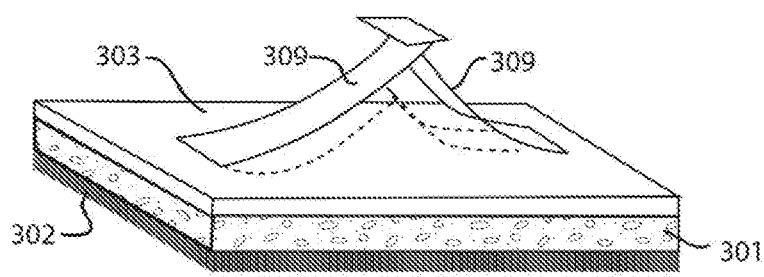
FIG. 3c. Top oblique view of coating applicator mechanism assembly, showing leaf-spring struts disposed for attachment to support structure.

In another exemplary embodiment, shown in FIG. 3c, where leaf-spring struts 309 are bendable leaf springs that substantially absorb fluctuations in applied vertical forces by bending in proportion to the applied forces. The force fluctuations are thereby substantially not transmitted to the underlying coating heads, whereby the vertical force applied to the coating heads resulting from the weight of the assembly remains substantially constant, ultimately allowing a substantially constant delivery of coating solution to the substrate.

Figure 3D:
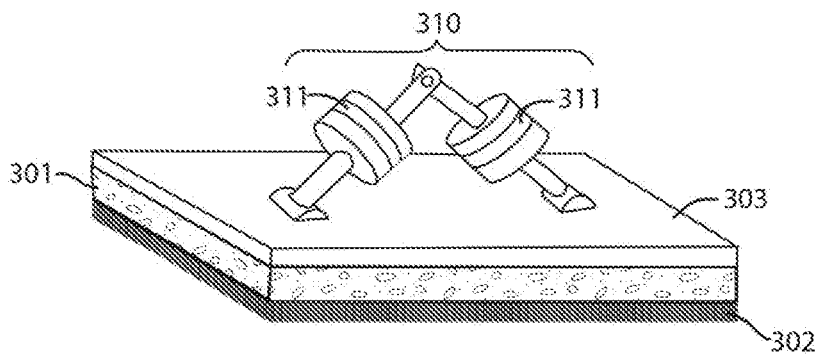
FIG. 3d. Top oblique view of coating applicator mechanism assembly, showing dashpot mechanism struts disposed for attachment to support structure.

In FIG. 3d, the force leveling mechanism is embodied as a shock-absorbing dashpot system. Here, the struts 310 comprise shock absorbing or dashpot structures 311. The structure may comprise simple compression springs, or may comprise more complex shock-absorbing devices, including viscoelastic materials. The shock absorbing struts 310 may be disposed as shown in FIG. 3d, either diagonally or vertically, connecting coating head 303 to the support structure.

In alternative embodiments, force-absorbing struts may intervene to connect the conveyance device to the support structure in lieu of or in addition to such struts used for the coating mechanisms.

Figure 4:
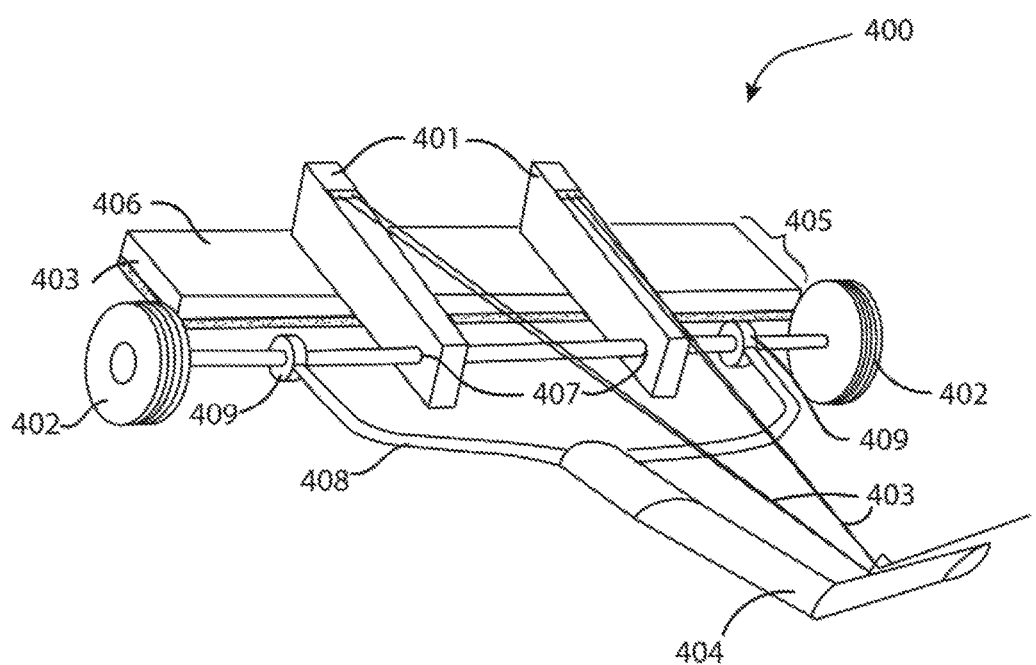
FIG. 4. Top oblique view of manually controlled embodiment of the inventive portable coating assembly.

In certain embodiments, the portable coating assembly may be manually guided across the substrate. FIG. 4. depicts one such embodiment, shown in this case without a motor drive, support structure 401 is rotatable about axle with wheels 402 by means of cables 403, which may be routed along handle 404 to an upper portion thereof (not shown) where a lever mechanism or equivalent may be used to raise and lower coating applicator head 405. To accomplish this, support structure 401 may be affixed to applicator head frame 406, but passage holes 407 may be made to pass axel 402 there through, allowing free rotation about axel 402 without placing a torque thereupon. In this way, applicator head 405 may rest on a substrate surface under its own weight. In addition, Handle 404 may be pivotally affixed to axel 402 via bracket 408, which is attached to axel 402 via bushings 409. In this way, vertical motions of handle 404 are decoupled from coating applicator head 405.

Figure 5A:
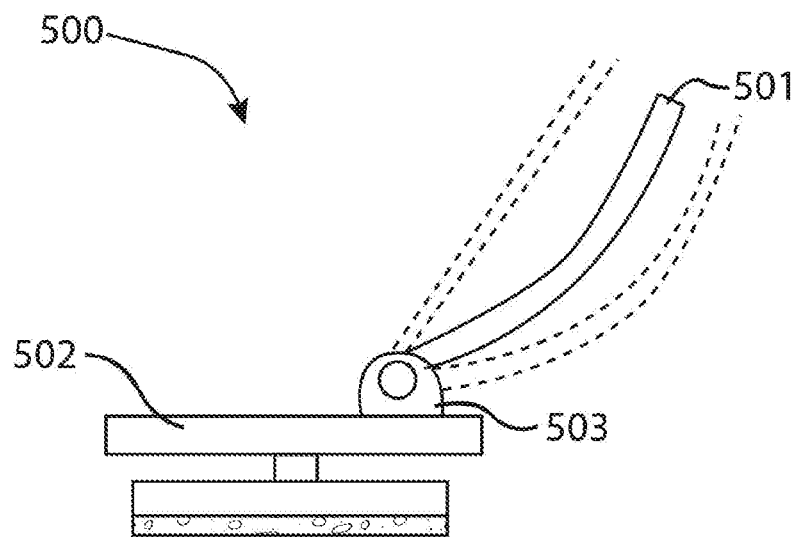
FIG. 5a. Side view of manually controlled embodiment of the inventive portable coating assembly, having a flexible handle structure, having a bendable leaf spring action to mitigate vertical forces.

In other manually guided embodiments, the applicator head assembly 500 in FIG. 5a may comprise an elongated handle 501 extending from the support structure 502 for use as a hand-held coating applicator. Application of energy transmission enhancement coatings require precision, particularly to obtain uniformity of thickness. Hand guiding the applicator may entail variations of stroke velocity and pressure applied, both of which may adversely affect the uniformity of the coating. For manual guidance of the applicator, the inventive applicator head assembly provides solutions for these deficiencies by the following aspects. Preferably, the handle 501 is pivotally affixed to support structure 502 as shown in FIG. 5a via pivot 503, in such a way that the angle between the support structure 502 and the handle 501 change gradually while the applicator head assembly 500 is manually guided across a surface. Handle 501 may be a flexible elongated structure as shown in FIG. 5a, whereby the entire handle 501 acts as a bendable spring lever or leaf spring when pressed upon.

The bendable spring-like aspect of the handle 501 absorbs hand force that may otherwise by directed vertically on the applicator head that may result in increased pressure on the substrate. The increased pressure may induce more flow of coating solution that may result in non-uniform coating thickness along a swath, which may be random if hand pressure changes erratically, or may result in gradual changes in coating thickness if hand pressure gradually increases and decreases along a swath due to the ergonomic relationship of the substrate position and the disposition of the operator's range of motion. The instant embodiment of the invention provides an ergonomic applicator head assembly for manually guided substrate coating by the force compensating handle for applying more uniform pressure on the applicator head while applying a coating on a substrate. Increasing hand force on the leaf spring (or spring lever) handle 501 bows it according to the magnitude of the applied force. The spring handle serves to absorb at least some of the vertical force and also may serve to more smoothly distribute the vertical forces over time, thus reducing the variation in forces applied vertically to the applicator mechanism assembly. Thus, the pressure applied to the substrate is more constant or uniform.

Figure 5B:
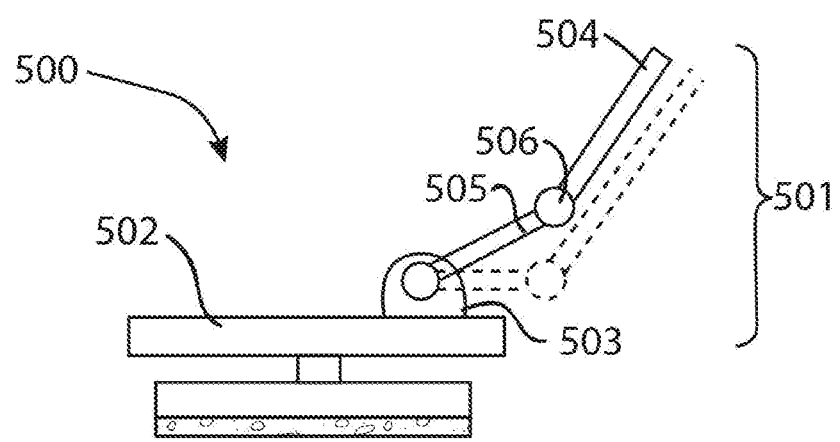
FIG. 5b. Side view of manually controlled embodiment of the inventive portable coating assembly, having a flexible handle structure, having a bendable lever spring action to mitigate vertical forces.

In another embodiment shown in FIG. 5b, the handle 501 may comprise two or more rigid portions 504 and 505, and a coil or lever spring 506 forming a joint between any two rigid portions. The function of the structure is the same as the flexible handle embodiment described above. However, in the instant embodiment the spring joint 506 bends in accordance to the applied hand force, and take up increased applied force while the structure transmits a more constant or uniform force to the substrate. The spring constant for the spring joint 506 may be low enough to allow for the handle to be readily bent with small hand forces. In this way, a minimum vertical force is applied to the inventive portable coating assembly 500, while small increases in hand force are readily absorbed. For the earlier embodiment, the spring constant of the spring lever or leaf spring handle may be low enough to bend easily with small increases in hand force to readily absorb the changes, mitigating fluctuations in vertical forces on the substrate. Controlling the vertical forces on the applicator portable coating assembly as discussed is advantageous for embodiments both with and without motor drive and with and without handles for guiding the applicator portable coating assembly across the substrate.

Figure 6:
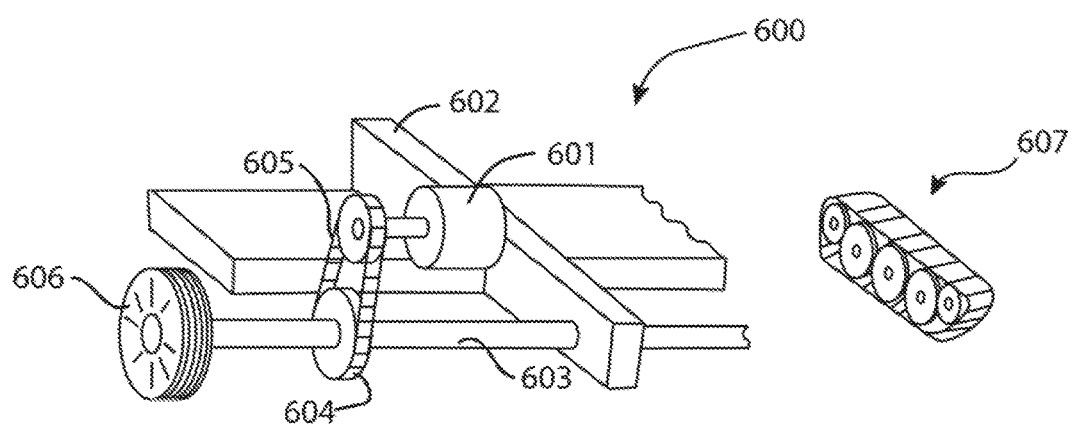
FIG. 6. Details of motorized drive coupling to drive axel.

As mentioned earlier, the innovative portable coating assembly provides a means of coating large area substrates such as solar panels with uniform coatings, for example, performance enhancement coatings. The innovation advantageously provides substantially uniform coatings by maintaining more uniform vertical forces on the assembly and by controlling travel speed. In some embodiments the innovative portable coating assembly is equipped with a motorized drive coupled to the conveyance device (e.g. a system using wheels) allowing controlled travel speed when deployed. In FIG. 6, such an arrangement is shown, where motor 601 affixed to support structure 602 may be coupled to axel 603 through sprocket 604 and chain 605. In other embodiments, motor 601 is commandable via a programmable motor controller circuit. The programmable motor controller circuit may further be adapted to be programmed and commanded wirelessly, and may be part of a closed or open feedback loop. Feedback control is described in greater detail in paragraphs below.

The conveyance device may comprise rollers, as for example, wheel 606 depicted in FIG. 6. Alternatively, the conveyance may be accomplished by use of tank tread (caterpillar track) 607. Other means, such as elongated roller extending the length of the support structure (disposed in front and rear of the support structure, for example) may be employed.

1. Non-Continuous Charging

Figure 7A:
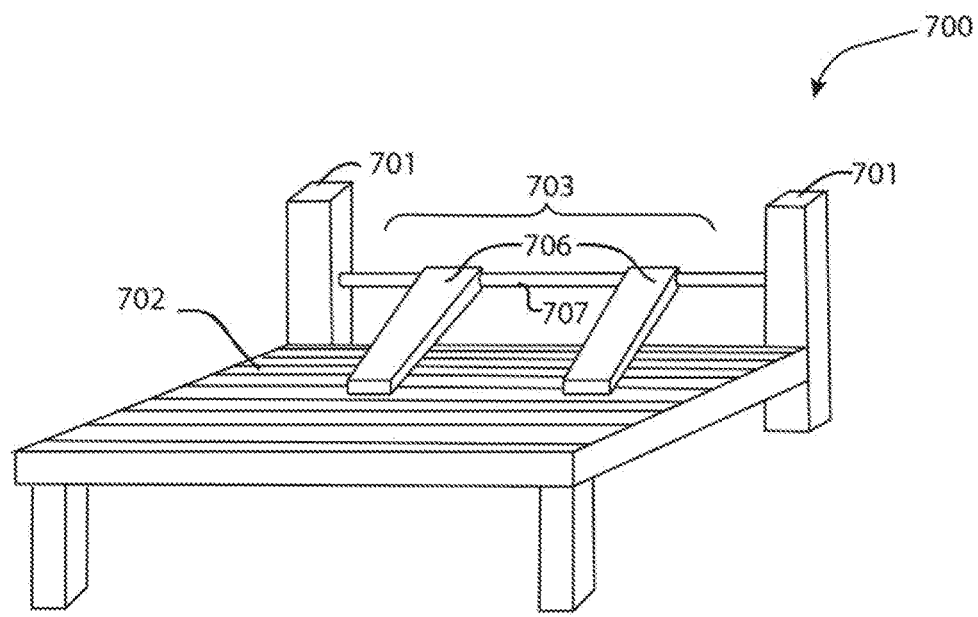
FIG. 7a. Top oblique view of portable coating assembly service station embodiment for transferring coating solution to coating applicator heads.
Figure 7B:
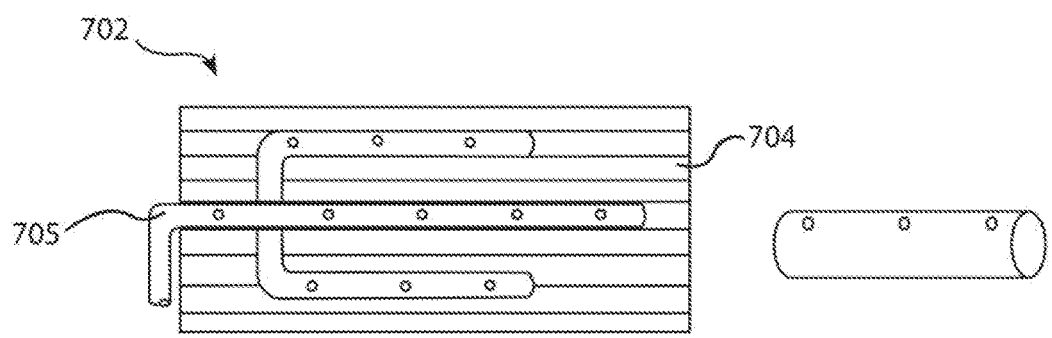
FIG. 7b. View of bottom side of dosing platform component of portable coating assembly services station.

Liquid coating solution may be transferred to the innovative assembly to fill the coating heads by simple dipping of the coating heads in a vat of solution. However, this method results in very random quantities of solution transferred to the coating head reservoirs. As one method of charging the innovative portable coating assembly may done in a non-continuous manner, the invention provides for the use of re-filling stations that are adapted to receive the portable coating assembly and charge the coating heads in a repeatable manner, dosing the heads with a reproducible quantity of coating solution. An example of such a re-filling station is shown in FIG. 7*a*. Service, or re-filling station 700 comprises a support frame 701 dosing tray or platform 702. In addition, a rotatable receiving stage 703 may be also pivotally affixed to the support superstructure above the dosing tray 702 for initially receiving, holding and then pivoting the portable coating assembly onto the dosing tray 702. In one embodiment, dosing tray 702 may be a mesh, or perforated with a plurality of holes. Further, on the underside 704 of tray 702 (FIG. 7*b*) may be in contact with tubing 705, having perforations through its wall. Tubing 705, depicted as a tube or pipe disposed along underside 704 of dosing tray 702, where the perforations are oriented upwards, that is, toward the underside 704. Tubing 705 functions to deliver coating solution to dosing tray 702 by allowing coating solution to flow out of the upward-facing perforations of tubing 705, and to flow onto the upper surface of dosing tray 702 via the plurality of holes. This action may spread the coating solution substantially over the surface of dosing tray 702.

In one embodiment, receiving structure 703 is adapted to receive the support structure of the innovative portable coating assembly by means of brackets 706 that extend from a rotating shaft 707. In a ready position, receiving structure 703 may be rotated such that brackets 706 are rotated upwards, forming an angle with respect to the vertical, and then locked or blocked in this position. Brackets 706 are adapted to receive the support structure of the innovative portable coating assembly by placement of the structure onto brackets 706, accomplished either manually or by a lifting mechanism. Receiving structure 703 may be then rendered free to rotate with its load, whereby it may be pivoted downward to rest the coating heads of the innovative portable coating assembly on top of dosing tray 702.

When placed thusly, the coating heads may be dosed by pumping coating solution to the dosing tray 702 via tubing 705. Dosing tray 702 is adapted to spread the coating solution over its upper surface, and to charge the coating head or heads by capillarity. By this arrangement, deformable porous cores of the coating heads are deformed to a predictable and repeatable geometry every time the portable coating assembly is placed on the dosing tray, due substantially to the weight of the assembly, as the coating heads may support the entire weight of the structure. In this way, a consistent volume of coating solution is taken up by the coating heads each time, allowing for the reproducible amount of liquid to be coated each time the portable coating assembly is charged.

2. Continuous Charging

An alternative means of charging the coating heads is by semi-continuous methods. In alternative embodiments, coating solution may be automatically fed to the one or more applicator heads of the innovative portable coating assembly by a pumping means. As an example, a small syringe pump may be used to deliver a controlled quantity of coating solution to the one or more applicator heads on an on-demand basis, by manual command of the syringe pump by the operator. This may be done when the operator perceives that the porous layer in each of the one or more applicator heads is low on fluid. By way of example, this may be accomplished by visual or audible signals. Alternatively, a pump may be configured for automatic delivery of the coating solution to the one or more applicator heads, whereby the pump may be programmed to deliver the required amount of coating solution to the one or more applicator heads before or during the coating excursion. In other embodiments, sensors, such as liquid conductivity sensors, measuring electrical conductance at one or more points in the one or more porous layers may be used to trigger the pump controller to provide a programmed amount of solution to the one or more applicator heads. A meter may be used in conjunction with the sensors to measure the amount of fluid or trigger the pump.

Figure 8:
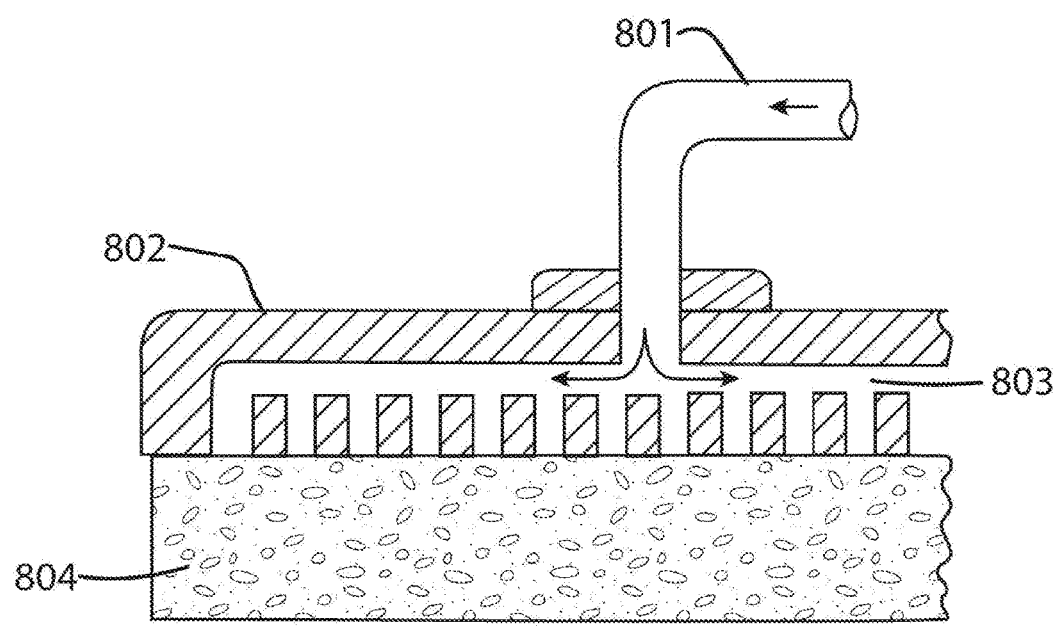
FIG. 8. Sectional view of alternative embodiment of coating applicator head, adapted for delivery coating precursor solution by pumping means to a distribution manifold built into the coating applicator mechanism.

An exemplary embodiment is shown in FIG. 8. A segment of tubing 801 may connect a pump to the base portion 802 of the support structure of the inventive applicator head assembly. Base portion 802 may comprise a plenum or a manifold 803 to distribute the coating solution to a porous deformable core 804 which may be in an overlying configuration relative to the base portion 802 of the support structure. FIG. 8 shows a porous compliant core 804 in intimate contact with the base portion 802 of the support structure, therefore coating solution may be transferred to the core 804 with no leaks. Fluid delivery of the pump may be determined by the rate of transfer of the coating solution to the substrate. As a further alternative, coating solution may be manually injected into the plenum or manifold of the base portion by the operator, whereby the operator replaces an electromechanical pump and manually controls a syringe containing coating solution, which is in fluid communication with the applicator head. In another instance, the pump may be replaced by a dosing pump for automated delivery of coating solution to the applicator head assembly.

Feedback Motion Control

The coating of such panels by the mobile coating apparatus of the instant innovation, such as detailed in the instant specification, may be facilitated by a sensor-based closed or open feedback loop in order to maintain a uniform coating thickness. In certain embodiments, sensors may measure parameters that may influence coating thickness, including, but not limited to, ambient temperature, ambient humidity, or amount of light reflection from the coated surface. Such sensors may be integrated into the design of the innovative mobile coating apparatus or incorporated in the overall feedback loop through portable sensing devices whereby the data collected is fed back to the mobile coating apparatus wirelessly or manually. Closed or open feedback loop automation may be managed by embedded microprocessor circuitry, where the embedded microprocessor executes algorithms that correlate data read from sensors to control parameters that may be used in a closed feedback loop to control a motor for automatically driving the instant mobile coating apparatus. In the case of an open feedback loop, control parameters may be displayed to a human operator to allow the human operator to make decisions as to the speed and direction of the innovative coating apparatus.

In certain embodiments, one or more sensors that provide feedback to the innovative mobile coating apparatus may comprise one or more spectrometric detectors employed to quantify reflectance of light from the surface of an uncoated substrate, or from the surface of a freshly-laid coating, whereby the reflected light may contain spectral information that indicates the presence or lack thereof of coating, or quality of freshly-laid coating. The innovative mobile coating apparatus spectrometric detector may comprise a light source adapted to illuminate a region of a substrate with a spot cross-sectional area of at least 1 $cm^2$, at the substrate surface, and a photodetector adapted to collect at least a portion of the light reflected from the substrate surface.

Figures 9A, 9B:
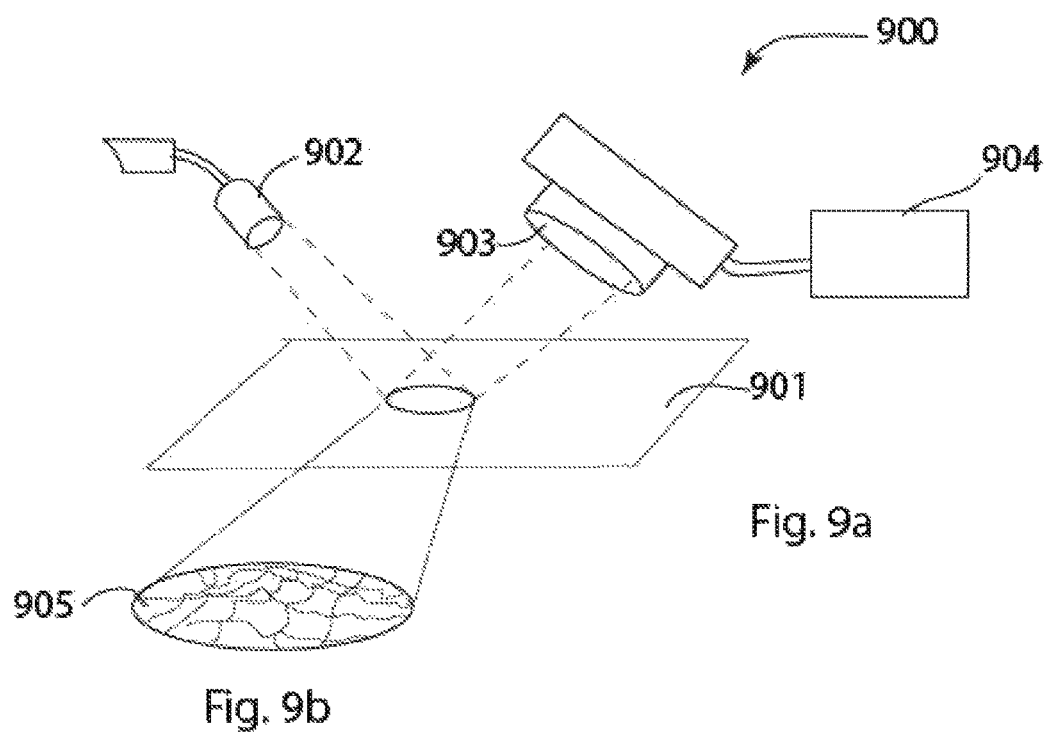
FIGS. 9a and 9b. a) Operational diagram of a photometric sensor. b) zoom view of an illuminated portion of a substrate surface (coated or uncoated) showing surface irregularities and non-uniformities.

An example of one embodiment of a sensor incorporated into said innovative mobile coating apparatus comprises a spectrometric detector and is shown in FIG. 9a. The basic schema of the sensor is shown, with substrate 901 illuminated by light source 902, and reflecting light to photodetector 903, which feeds its signal to signal processing board 904. According to the innovation, the spot size cross-sectional area is at least 1 $cm^2$ in area. In FIG. 9b, a zoom view of the region illuminated by the incident light is shown. The illuminated region has a plurality of non-uniformities in a portion of coated substrate, where a plurality of small asperities and thin areas are present, resulting in micro-variations of coating thickness. In this embodiment, photodetector 903 is not adapted to spatially resolve the light impinging upon it. Individual light rays reflected from the totality of these micro-variations may be integrated when collected at the photodetector 903 such that the intensity variations in the individual light rays are spatially averaged as to a single signal level.

Photodetector 903 may comprise a spectrometer, adapted to resolve light intensity as a function of wavelength. Alternatively, photodetector may comprise a photodiode or phototransistor adapted to yield a voltage level corresponding to the averaged light intensity of the reflected light. Filters, such as bandpass or cutoff filters, may furthermore be used to block portions of the light spectrum in conjunction with a photodiode or phototransistor detectors to approximate a spectrometer.

Figure 10:
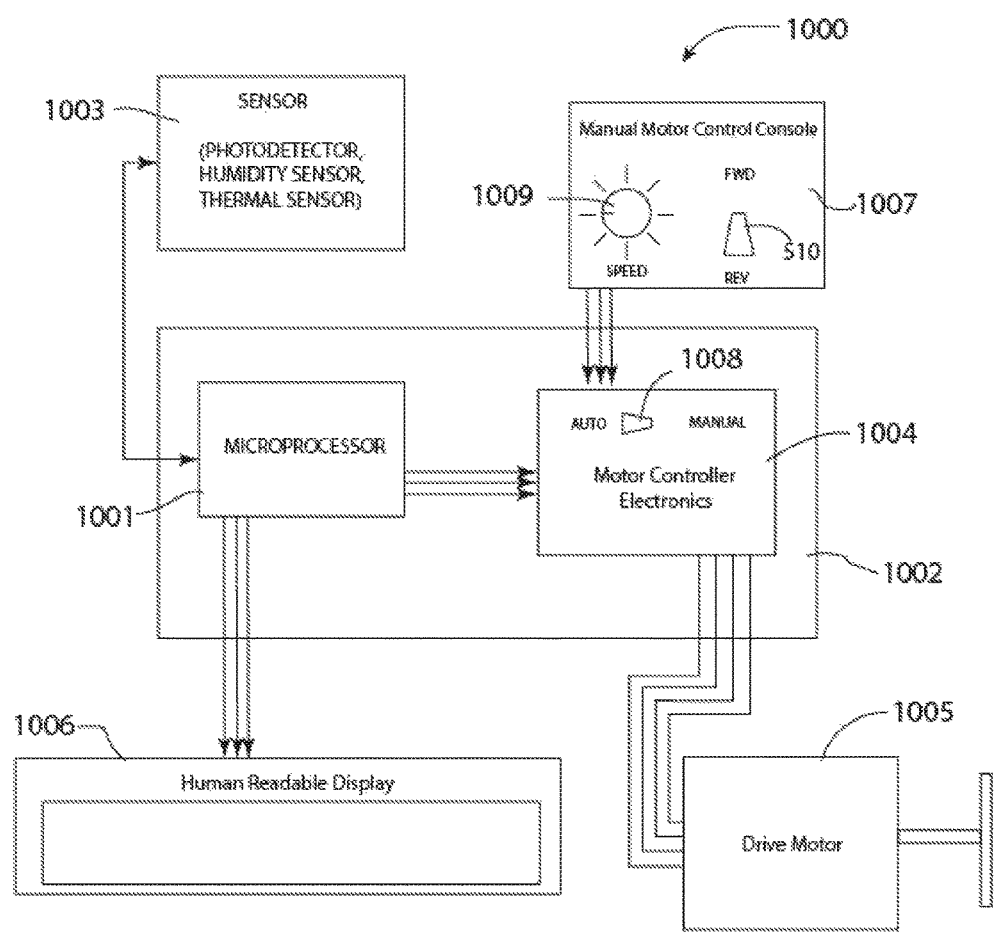
FIG. 10. Schematic diagram of an exemplary electronic control system embodiment for controlling a mobile coating apparatus using both closed- and open-loop feedback.

The sensor may further comprise signal processing circuitry adapted to digitize the raw analog data collected by the photodetector. This is shown in the block diagram of FIG. 10, showing a control system 1000 for a mobile coating apparatus. The exemplary mobile coating apparatus control system 1000 may be governed partially or fully by microprocessor 1001, which may be physically incorporated on signal processing board 1002.

Microprocessor 1001 is shown to be in electronic communication with sensor 100, which may be, but by no means limited to, a spectrometer, humidity sensor or thermal (temperature) sensor. Other environmental sensors may be employed, where the sensed parameter has a bearing on the quality of freshly-laid coating solution that has not cured to a hardened coating, or a measure of the extent of coating, meaning having the ability to discriminate between coated and uncoated substrate.

Microprocessor 1001 is also shown to be in communication with motor controller electronics board 1004. Analog voltage or current signals issuing from sensor 1003 may be digitized to binary code by an analog to digital converter (ADC) unit, which may reside on sensor 1003 itself, or by an ADC integrated on the microprocessor chip, or by a separate ADC unit residing on signal processing board 1002. Raw analog signals generated by sensor 1003 may constitute photometric data, wherein the photometric data may comprise spectral information, or at least integrated light intensity information. The photometric data in turn relate characteristics of the coating, in the uncured or cured state, such as total reflectance, spectral reflectance, and indirect measurements such as film thickness and roughness. Conversion of photodetector signals into binary format may constitute photometric data, read by microprocessor 1001.

Consequently, microprocessor 1001 may issue motor control commands generated by one or more algorithms embodied in software stored in a RAM or ROM accessible by microprocessor 1001, where the algorithms process the output of photometric data from sensor 1003. Commands issued by microprocessor 1001 may be received by motor control electronics board 1004 in the form of continuous analog voltage levels or voltage pulses to drive a stepper motor or a dc motor, either type shown schematically by motor 1005. Both motor direction and speed may be controlled by motor control electronics board 1004. The control circuitry constitutes a closed-loop embodiment of the mobile coating apparatus control system, which is automatic control based on decisions made by algorithms embodied in the software executed by microprocessor 1001.

In another embodiment, the mobile coating apparatus control system may be an open-loop control system. Microprocessor 1001 is also shown to be in electronic communication with human-readable display 1006, whereas motor control electronics board 1002 is shown also to be in electronic communication with manual motor control console 1007. In the open-loop control scheme, a human operator may read output displayed on human-readable display 1006, which may be a serial or parallel input LCD display. In the example shown in FIG. 10, a selection switch 1008 is provided to select between manual control or microprocessor control of the motor controller electronics. To facilitate manual coating process control, the analysis algorithms embodied by software stored on a RAM or ROM accessible to microprocessor 1001 may be adapted to communicate process optimization recommendations that are electronically displayed to the human operator, using human-readable display 1006 disposed on a hand-held or apparatus-mounted sensor, as an example. Microprocessor 1001 may also be in electronic communication with a wireless network interface (not shown) adapted to transmit data over the internet wirelessly in some embodiments for display on a computing device.

Characters output from microprocessor 1001 to human-readable display 1006 may be in a format understandable to the human operator, and indicate, for example, recommendations of motor speed and/or direction may be controllable by the human operator, in order to maintain optimized coating quality. The decision as to what speed the apparatus should be travelling along the substrate, for example, may be based on photometric data generated by sensor 1003. By way of example, the photometric data may indicate coating thickness, which may be dependent on the speed of the apparatus. These recommendations may also include exhortations to decrease the viscosity of the coating solution, and or change the make-up coating to optimize coating performance. In the open-loop control embodiment, control data are output to the human operator by means of human-readable display 1006. The human operator may read and interpret the control data, and control the speed and direction of motor 1005 by means of manual motor control console 1007. Rotary manual speed control 1009 may comprise a potentiometer or a rotary encoder. Other forms of manual control may be used, such as a linear slider potentiometer. Double throw switch 1010 may be manipulated to control motor direction, causing the mobile coating apparatus to advance in the forward direction or reverse.

In embodiments employing a photodetector, as sensor 1003 in FIG. 10, the photodetector may comprise a spectrometer that resolves the intensity of reflected light as a function of wavelength. In other embodiments, the photodetector comprises a photodiode or phototransistor. Both types may integrate the total light intensity over the entire capture spectrum of the reflected light. A variation includes the use of a bandpass filter or cutoff filters to examine a portion of the visible or invisible spectrum, the latter referring to the infrared (IR) and the ultraviolet (UV) extensions of the visible spectrum. In other embodiments, sources having a more narrow range of wavelengths, such as lasers, light emitting diodes (LEDs), cold cathode and heated cathode gas discharge lamps, such as mercury lamps and inert gas plasmas, may be employed as light sources.

The relatively large spot size of the incident beam provides the advantage of spatially integrating surface features over the area covered by the illuminated region covered by the spot. In this way, the innovative mobile coating apparatus reflectance sensor is further adapted to spatially and temporally integrate the spectral characteristics of the light reflected and collected from the illuminated region of the substrate, where the photodetector is in electronic communication with the signal processing circuit. The signal processing circuit may be adapted to perform read operations to capture the signals from the photodetector on receiving a command signal, and may be further adapted to extract and store digitized photometric data from the captured sensor signal.

In addition, the signal processing circuit may be adapted to perform computations on the photometric data, and then correlate the data to the one or more of the characteristics of the thin film coating on the substrate of interest. It is an aspect of these embodiments of the innovative mobile coating apparatus that the correlated characteristics of the freshly-laid coating be transformed into control information to be fed back to either a human operator or to a controlling device for assessing the quality of the coating as it is applied from a liquid coating precursor solution, and if necessary adjusting the coating deposition method or coating composition. In this way, the deposition process may be steered to produce a finished coating having optimal performance.

The coating apparatus may be controlled manually by a human operator, or automatically or semi-automatically by an automated control system. In the automatic or semi-automatic cases, the innovative mobile coating apparatus sensor may be used as a feedback component in a closed control loop.

It is an aspect of the innovation that the light source produces a light beam having a spot cross-sectional area of at least 1 cm$^2$ at the substrate surface. Commercially available light sensors based on total reflection and/or spectral reflection measurements used for measuring thin film or substrate surface characteristics use small spot sizes (typically 1-2 mm in diameter). Many of these devices are designed for use in measuring surface characteristics of small substrates, such as silicon wafers. For both large and small substrates, multiple readings taken at several locations on the substrate are generally necessary to obtain a representative sample of coating or surface characteristics. The larger spot size of the instant invention allows integration of superficial properties over an area 50-100 times or larger than that provided by conventional fiber optic devices, providing a representative sampling of the local region of the surface from which the light is reflected.

It is another aspect of the invention to provide a means to correlate photometric data obtained from the light reflected off of a substrate surface and collected by the photodetector. For example, the surface may have a previously-cured performance enhancement coating, such as an anti-reflection coating, or a freshly applied liquid coating precursor solution. Optionally, the surface may be uncoated, where a measurement may be made to obtain baseline data of initial reflectance for a before-and-after comparison when a coating is applied. The raw photometric data collected may provide a measure of the reflectance of the substrate surface, as, for example, to measure the attenuation of percent reflection after application of an antireflection coating.

Another measurement derived from the raw photometric data may be the thickness and quality of coverage of a fresh layer of coating precursor solution. The photometric data may be in the form of spectral intensity data. In this case, the photodetector may incorporate a spectrometer that can scan over a range of wavelengths. In other embodiments, the photodetector may be a simple photodiode or phototransistor that is adapted to measure across a broad spectrum of light, and may be used to measure intensity integrated over the entire visible, near IR and UV spectrum to which is it sensitive, or a portion thereof, if, as an example, a bandpass filter is used. It is another aspect of the instant innovation that this information may be used for feedback control in a coating process control loop for the coating apparatus. The coating apparatus may be controlled by a human operator in one set of embodiments, thus the control loop is an open loop, or may be machine-controlled in another set of embodiments, necessitating a closed feedback control loop.

The signals may be used to indicate the thickness of a coating. As an example, a relatively high average reflectance intensity reading and a shift toward the reddish part of the spectrum in the reflected light may indicate that a performance enhancement coating is too thick as applied. The operator or automatic control system may need to adjust the speed of the applicator, or decrease coating precursor solution viscosity. As the spot size is large, variations normally encountered in both coating non-uniformities and variations in the underlying substrate surface, such as photovoltaic panel cover glass or photovoltaic cell surface, are integrated over the spot area and collected by the photodetector. Thus, the photodetector receives a reflection spectrum that is averaged over the relatively large spot size. The spectral intensity data may be averaged over a range of wavelengths to determine a predominant component or spectral region. By subtracting the reading from one area measured prior to coating from the reading of the same area after coating, variations other than those of the coating itself may be canceled out.

Multiple readings may be made, for example, over very large areas where several locations on the substrate surface or multiple substrate surfaces may be sampled. In this way, the uniformity of surface characteristics may be assessed. As an example, for an anti-reflection coating, the uniformity of the coating thickness and quality may be quantified. This is particularly advantageous for applying new coatings to a substrate such as a photovoltaic panel or to multiple substrates such as a solar panel array. An operator of a coating apparatus may use a portable embodiment of the reflectance sensor to monitor the quality of the coating process by measuring the spectral characteristics of the reflected light.

As an example of a method of use, an operator of the coating apparatus may first take baseline measurements on an uncoated photovoltaic panel, then apply a thin film of liquid precursor solution that will cure to form a finished coating, such as an antireflection coating.

The innovative mobile coating apparatus reflectance sensor may include signal processing circuitry comprising an on-board microprocessor and memory, on which may be stored one or more algorithms and/or look-up tables for correlation of measurements to known film characteristics. As an example, the sensor may include a spectrometer that is programmed to scan a range of wavelengths and record spectral intensities. The data may be digitized and stored as binary data in the on-board memory, where the microprocessor may compare the intensity data reflected from the freshly applied liquid coating to the baseline data taken from the bare (uncoated) surface of the photovoltaic panel. In another embodiment, the data may also be offloaded to an off-board data storage and retrieval system, accessed by the sensor using wired or wireless means.

As an example of process control by use of the innovative mobile coating apparatus sensor, the comparison algorithm may reveal that the reflection spectral intensities are higher than expected for an antireflection coating, and moreover the intensities are stronger in the red end of the spectrum measured, having been red-shifted in comparison to the expected spectrum reflected (for example in comparison with a ¼ wave-thick index matching film). These spectral characteristics would indicate that the coating is too thick. In this example, it may be thicker than the ¼ wavelength thickness necessary to cancel reflections at more centralized wavelengths, thus being detuned and allowing longer wavelengths to be reflected than would be the case for a film with the proper ¼ wavelength thickness.

A further aspect of the innovation may be the inclusion of an algorithm to present recommendations to the operator as to steps required to adjust the coating process to optimize the coating. Here, the coating thickness may be a function of applicator speed and viscosity of the liquid coating precursor solution. The coating process may be adjusted, for example, by changing applicator speed, or by changing solution viscosity. In addition, the coating thickness may be corrected, if found to be out of specification by measurements taken with the innovative mobile coating apparatus sensor, by applying a make-up coating.

In further embodiments of the innovation, measurements of air temperature and surface temperatures of the substrate may be incorporated into the sensor system design and algorithms. Thermal measurements may be used for further optimization of the coating process, as evaporation rates and curing rates may be taken into consideration by the optimization algorithm, preferably stored in on-board memory and executed by an on-board microprocessor, thereby adjusting the recommendations to the operator as to the optimal coating speed and solution viscosity, for example. In further embodiments, humidity sensors may also be a part of the sensor array to further refine the coating process, if, as an example, relative humidity affects the evaporation rate of the solvent used in the precursor solution, or if humidity affects (or is necessary to initiate) the curing chemistry of the coating.

In other embodiments of the instant innovation, an automated control system may replace the operator of the coating apparatus as being the recipient of the feedback from the innovative mobile coating apparatus sensor signal processing circuitry. The automated control system may be adapted to directly respond to the feedback issuing from the sensor signal processing circuitry. In one example, the sensor may be mounted on a coating apparatus, and configured to continuously or intermittently measure the surface characteristics by refection spectrometry. In this example, the sensor is aimed at the substrate surface behind the apparatus, so that the freshly coated surface may be measured.

The characteristics of the freshly applied coating may be assessed, and the speed of the coating apparatus may be controlled by a closed feedback loop. In other embodiments, one sensor may be situated in such a way as to measure the substrate reflection before coating and another sensor may be situated to measure the substrate reflection after coating, with the difference in reflection measurements being used to inform the coating process.

For instance, incandescent light sources may be used having coatings yielding different IR and visible spectra, or black body temperatures, as is commercially available with incandescent bulbs. Other sources may be used as well, such as mercury lamps, inert gas glow discharge (cold and heated cathode) sources, LED or laser sources. In addition, 'white' light sources using bandpass or cutoff filters may be employed. The choice may be dictated by the desired spectral range of the incident light.

Additional embodiments of this innovation may include multiple light sources of the same or different types and multiple photodetectors of the same or different types. The different types may be used to detect more accurately particular wavelengths of interest. For example, a light source and/or photodetector tuned to more accurately identify blue wavelengths in conjunction with a light source and/or photodetectors tuned to more accurately identify green and or red wavelengths may provide accurate information about the characteristics of the coating without having to integrate over the whole spectrum. Such specially tuned light sources and/or photodetectors may operate in parallel or sequentially to each other in the measurement process.

Output port may be a USB port, RS232 port or a parallel port for data exchange with an external computing device. In other embodiments, a wireless communication IC, such as a Bluetooth, cellular or wifi IC may also be included for wireless communication with an external computing device or the internet.

Figure 11:
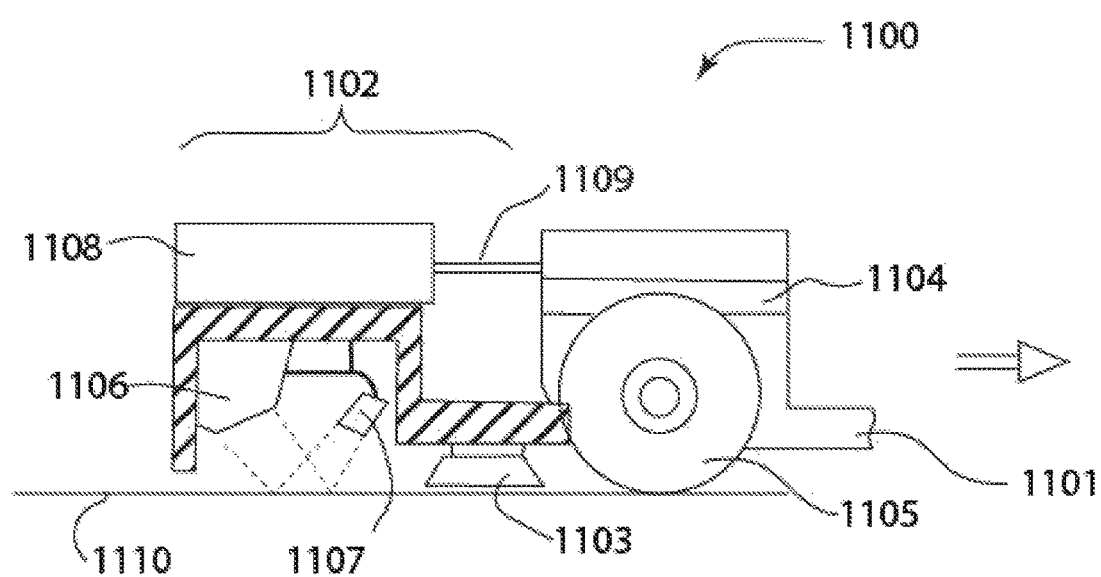
FIG. 11. A side-sectional view of an embodiment of sensor mounted on a coating apparatus.

In FIG. 11, mobile coating apparatus 1100 is shown in a side view. Mounted on the rear side of chassis 1101 of the mobile coating apparatus is reflectance sensor 1102. Also shown affixed to chassis 1101 is coating head 1103 and motor 1104 that is coupled to wheel 1105. Reflectance sensor 1102 is shown as a side sectional view, revealing internal components. These components comprise light source 1106 and photodetector 1107, where source 1106 shines a wide beam of light making a spot size with a cross-sectional area of at least 1 $cm^2$, on the surface of substrate 1110. Light is reflected from substrate 1110 to photodetector 1107.

As specified above, photodetector 1107 may be a spectrometer adapted to scan over a range of wavelengths, or a photodiode or phototransistor that integrates light intensities over a large range of wavelengths. As described above, the raw signal from photodetector 1107 is fed to signal processing board 1108, comprising a microprocessor and an on-board memory. The microprocessor may execute algorithms stored in on-board memory that digitize the analog signal to binary data, then analyze the data as photometric measurements such as spectral data, or overall reflectance data to show changes in surface reflectance before and after application of a coating solution by the coating apparatus. The analysis routines may require baseline data for comparison, thus requiring a measurement of the uncoated substrate or of a previously coated substrate. Before-and-after data may be compared, and changes in the spectral characteristics or reflectance values may be correlated to coating characteristics, such as film thickness.

For this conclusion, a look-up table may be employed by the microprocessor, or calculation formulas may be employed as part of the algorithm. As an example, a red shift in the reflectance spectrum may indicate that the film is too thick. The algorithms may then generate feedback control data that may be output as human-readable values, or as command signals to motor drive electronics, forming a closed control loop with the motor drive. Referring to FIG. 11, signal processing board 1108 is shown in electronic communication with drive electronics of motor 1104 via signal cable 1109. The command signals may command the motor to slow down, since the film thickness decreases at slower speeds of the mobile coating apparatus.

Method of Use

For the purposes of illustration, a method of use of the innovation will be described. As noted above, the innovation solves the problem of field-retrofitting installed photovoltaic panels and glass window panels with high-quality performance enhancement coatings, for example, energy transmission enhancement coatings, which may include, but not be limited to thin-film antireflective coatings. The example covers coating a photovoltaic panel that is part of an outdoor array. The first step is to place the portable coating assembly on the surface of a photovoltaic panel. This step may comprise manually lifting the portable coating assembly onto the panel using an elongated handle, engaging the rollers on the top surface of the panel [or outer frame rails of the panel]. The operator may wish to use the motor drive to position the applicator head more precisely. In this case, the applicator heads may be retracted, so as not to contact the surface of the solar panel.

To coat the panel, the applicator heads may be lowered to contact the surface of the panel, and the motor drive may be engaged to set the portable coating assembly in motion and on a trajectory to travel from the starting end of the panel to the opposite end. The motor speed may be preset to deposit a coating of a given thickness, where the speed may be known by previously developed empirical correlations between excursion speed and coating thickness. Alternatively, in automated embodiments, the speed may be determined by the aforementioned electronic motor control circuit based on sensor measurements of certain parameters that may include, but are not limited to, ambient temperature, ambient humidity, or amount of light reflection from the coated surface.

The length of the trajectory may be known in advance as well, and may be pre-programmed into the motor control circuit, or programmed in the field by the operator before starting the coating process (wirelessly as well). The trajectory of the portable coating assembly may then be predetermined to travel the length of the panel in one direction with the conveyance devices engaged. Upon reaching the opposite end, the coating head may then be disengaged from the panel surface. Alternatively, the coating head may then reverse trajectory and travel back to the starting end and allowed to remain engaged with the panel surface and continue to deposit coating solution on the reverse trajectory.

Open Loop Feedback Example

An example of how the instant innovation is employed will now be described. A substrate such as a photovoltaic panel may be deployed in an array or individually in an outdoor setting. It is desired to retrofit the panel with an anti-reflective coating, for which a coating apparatus of the type disclosed herein is provided. This coating device may comprise wheels and coating heads such that it may be deployed to roll over a photovoltaic panel and deposit a liquid coating pre-cursor solution that is to be cured after application.

An operator equipped with a portable version of the innovative mobile coating apparatus light reflectance sensor may deploy it on the panel surface before the coating is applied, to obtain a baseline measurement of percent reflection of incident light as the photometric data. After the baseline measurement, the coating is applied by the coating apparatus. A second percent reflection measurement is then taken. Data from both measurements are digitized by the signal processing circuit and stored in an on-board memory.

The data are then processed by the signal processing circuitry on-board the sensor, as described above, where the two measurements are compared. A change in percent reflection obtained, with data from the second measurement correlated to the state of the newly applied coating solution. The signal processing circuit then displays the information to the operator. If the coating is too thick or thin, instructions or recommendations are displayed to the operator as a method of feeding back to the operator in control to adjust the speed of the coating apparatus, or to alter the viscosity of the coating solution. The information may also be conveyed by connection to a laptop computer, or wirelessly to a smart phone in possession of the operator at the site, or to personnel at a remote site.

While the forgoing embodiments disclosed above describe the invention in its various manifestations, the foregoing embodiments are to be understood by persons skilled in the art as exemplary in nature, and are in no way intended to be construed as the only embodiments possible for the invention. Those skilled in the art will also understand that other embodiments and examples of deployment of the inventive coating apparatus are conceivable and possible without departing from the scope and spirit of the invention.

We claim:

1. A portable solar panel coating apparatus for coating solar panels in an outdoor solar panel array, comprising:
   a support structure;
   one or more performance enhancement coating applicator mechanisms disposed on the support structure, said coating applicator mechanisms configured to conform to contours in one or more of the solar panels, said one or more of the coating applicator mechanisms comprising a deformable porous structure to dispense a liquid performance enhancement coating material on the one or more of the solar panels, wherein said performance enhancement coating material forms a solid coating that performs one or more functions, and wherein at least one function is an anti-reflection function;
   one or more photometric sensors to receive reflected light from one or more uncoated portions of the one or more solar panels and reflected light from one or more coated portions of the one or more solar panels, wherein the coated one or more portions of the one or more solar panels are coated with the performance-enhancement coating material; a motorized conveyance mechanism to convey the one or more of the coating applicator mechanisms along the one or more of the solar panels at a speed determined at least in part by one or more characteristics measured by the one or more photometric sensors of the performance-enhancement coating material dispensed on the one or more of the solar panels by the one or more of the coating applicator mechanisms, wherein the thickness of the solid coating is determined at least in part by the speed of the motorized conveyance mechanism;

one or more pumps to meter liquid coating solution to the one or more performance enhancement coating applicator mechanisms;

and a service station to provide liquid coating solution to the one or more performance enhancement coating applicator mechanisms, wherein the service station comprises: a superstructure;

a dosing platform, having a plurality of sides, and a plurality of perforations disposed therethrough, the dosing platform to disperse a liquid coating solution along a top side, the top side of said dosing platform to receive the portable solar panel coating apparatus or a portion thereof;

at least one liquid conduit disposed on an underside of the dosing platform, the at least one liquid conduit having one or more apertures disposed along its wall whereby the interior of the at least one liquid conduit is in communication with the exterior, wherein the at least one liquid conduit is to deliver a liquid coating solution to the dosing platform; and a movable structure to apply a repeatable vertical force to the portable solar panel coating apparatus or a portion thereof, wherein the portable solar panel coating apparatus or a portion thereof is to be positioned on or near the top side of the dosing platform.

2. The portable solar panel coating apparatus of claim 1, wherein the service station comprises a lifting mechanism to lift the portable solar panel coating apparatus or a portion thereof.

3. The portable solar panel coating apparatus of claim 1, wherein the one or more performance enhancement coating applicator mechanisms are to be raised and lowered relative to one or more of the solar panels.

4. The portable solar panel coating apparatus of claim 1, wherein the dosing platform may comprise a combination of one or more of the following: a mesh; or a plate perforated with a plurality of holes.

5. The portable solar panel coating apparatus of claim 1, wherein rotation of the one or more performance enhancement coating applicator mechanisms about an axis enables a repeatable vertical force to be applied to the one or more performance enhancement coating applicator mechanisms and the raising and lowering of one or more of the performance enhancement coating applicator mechanisms relative to one or more of the solar panels.

6. The portable solar panel coating apparatus of claim 1, further comprising a circuitry to adjust operation of the portable solar panel coating apparatus, wherein said circuitry is to correlate one or more characteristics measured by one or more of the photometric sensors to at least one of the following: the thickness of the solid coating, the speed of the motorized conveyance mechanism, or the rate of the deposition of the liquid coating solution.

7. The portable solar panel coating apparatus of claim 6, wherein the circuitry is to correlate spectral characteristics of reflected light received by one or more of the photometric sensors to the thickness of the performance enhancement coating dispensed on one or more coated portions of one or more of the solar panels by one or more of the coating applicator mechanisms.

8. The portable solar panel coating apparatus of claim 6, wherein the circuitry is to command the motorized conveyance mechanism to convey one or more of the coating applicator mechanisms along one or more of the solar panels at a speed determined at least in part by the thickness of the solid film.

9. The portable solar panel coating apparatus of claim 6, wherein the one or more photometric sensors is coupled to the circuitry.

10. The portable solar panel coating apparatus of claim 1, wherein the one or more photometric sensors is at least one of the following:
disposed on the support structure;
disposed on the one or more of the coating applicator mechanisms; or
carried by the hand of a human.

11. The portable solar panel coating apparatus of claim 6, wherein the circuitry is to output at least one of one or more correlated characteristics of a coating in a human-readable format.

12. The portable solar panel coating apparatus of claim 6, further comprising a thermal sensor coupled to the circuitry, wherein the thermal sensor reads a temperature that correlates with at least one of the following: the thickness of the solid coating, the speed of the motorized conveyance mechanism, or the rate of the deposition of the liquid coating solution.

13. The portable solar panel coating apparatus of claim 6, further comprising a humidity sensor coupled to the circuitry, wherein the humidity sensor reads a relative humidity that correlates with at least one of the following: the thickness of the solid coating, the speed of the motorized conveyance mechanism, or the rate of the deposition of the liquid coating solution.

14. The portable solar panel coating apparatus of claim 6, further comprising a human-machine interface coupled to the circuitry, wherein the human-machine interface comprises one of a touch screen or a key pad.

15. The portable solar panel coating apparatus of claim 6, further comprising a wireless interface coupled to the circuitry, wherein the wireless interface is to send and receive data wirelessly.

16. The portable solar panel coating apparatus of claim 1, wherein said performance enhancement coating is a multi-functional coating having at least one function selected from the group consisting of: an anti-reflection function, a wavelength shifting function, an optical filtering function, a low-E function, an anti-soiling function, a self-cleaning function, or an energy transmission-enhancement function.

17. The portable solar panel coating apparatus of claim 1, wherein the one or more pumps is to be in fluidic communication with the one or more of the coating applicator mechanisms through one or more tubes or channels that extend from a fluid reservoir.

18. A portable solar panel coating apparatus for coating solar panels in an outdoor solar panel array, comprising:
a support structure;
one or more performance enhancement coating applicator mechanisms disposed on the support structure, said coating applicator mechanisms configured to conform to contours in one or more of the solar panels, said one or more of the coating applicator mechanisms comprising a deformable porous structure to dispense a liquid performance enhancement coating material on the one or more of the solar panels, wherein said performance enhancement coating material forms a solid coating that performs one or more functions, and wherein at least one function is an anti-reflection function;

one or more photometric sensors to receive reflected light from one or more uncoated portions of the one or more solar panels and reflected light from one or more coated portions of the one or more solar panels, wherein the coated one or more portions of the one or more solar panels are coated with the performance-enhancement coating material; a motorized conveyance mechanism to convey the one or more of the coating applicator mechanisms along the one or more of the solar panels at a speed determined at least in part by one or more characteristics measured by the one or more photometric sensors of the performance-enhancement coating material dispensed on the one or more of the solar panels by the one or more of the coating applicator mechanisms, wherein the thickness of the solid coating is determined at least in part by the speed of the motorized conveyance mechanism;

one or more pumps to meter liquid coating solution to the one or more performance enhancement coating applicator mechanisms;

and a service station to provide liquid coating solution to the one or more performance enhancement coating applicator mechanisms, wherein the service station comprises: a superstructure;

a dosing platform, having sides, and a plurality of perforations disposed therethrough, the dosing platform to disperse a liquid coating solution along at least one side of the dosing platform, said at least one side to receive the portable solar panel coating apparatus or a portion thereof;

at least one liquid conduit disposed on a first side of the dosing platform, the at least one liquid conduit having one or more apertures disposed along its wall whereby the interior of the at least one liquid conduit is in communication with the exterior, wherein the at least one liquid conduit is positioned on a first side of the dosing platform and is to deliver a liquid coating solution to the first side or a second side of the dosing platform;

a movable structure to apply a repeatable vertical force to the portable solar panel coating apparatus or a portion thereof; and wherein the portable solar panel coating apparatus or a portion thereof is to be positioned on or near at least one side of the dosing platform.

19. The portable solar panel coating apparatus of claim 18, wherein the service station comprises a lifting mechanism to lift the portable solar panel coating apparatus or a portion thereof.

20. The portable solar panel coating apparatus of claim 18, wherein the one or more performance enhancement coating applicator mechanisms are to be raised and lowered relative to one or more of the solar panels.

21. The portable solar panel coating apparatus of claim 18, wherein the dosing platform may comprise one or more of the following: a mesh; or a plate perforated with a plurality of holes.

22. The portable solar panel coating apparatus of claim 18, wherein rotation of one or more performance enhancement coating applicator mechanisms about an axis enables a repeatable vertical force to be applied to the one or more performance enhancement coating applicator mechanisms and the raising and lowering of one or more of the performance enhancement coating applicator mechanisms relative to one or more of the solar panels.

23. The portable solar panel coating apparatus of claim 18, further comprising a circuitry to adjust operation of the portable solar panel coating apparatus, wherein said circuitry is to correlate one or more characteristics measured by one or more photometric sensors to at least one of the following: the thickness of the solid coating, the speed of the motorized conveyance mechanism, or the rate of the deposition of the liquid coating solution.

24. The portable solar panel coating apparatus of claim 18, wherein the circuitry is to correlate spectral characteristics of reflected light received by one or more photometric sensors to the thickness of the performance enhancement coating dispensed on one or more coated portions of one or more of the solar panels by one or more of the coating applicator mechanisms.

25. The portable solar panel coating apparatus of claim 18, wherein the circuitry is to command the motorized conveyance mechanism to convey one or more of the coating applicator mechanisms along one or more of the solar panels at a speed determined at least in part by the thickness of the solid film.

26. The portable solar panel coating apparatus of claim 18, wherein the one or more photometric sensors is coupled to the circuitry.

27. The portable solar panel coating apparatus of claim 18, wherein the one or more photometric sensors is at least one of the following:

disposed on the support structure;

disposed on the one or more of the coating applicator mechanisms; or carried by the hand of a human.

28. The portable solar panel coating apparatus of claim 18, wherein the circuitry is to output at least one of one or more correlated characteristics of a coating in a human-readable format.

29. The portable solar panel coating apparatus of claim 18, further comprising a thermal sensor coupled to the circuitry, wherein the thermal sensor reads a temperature that correlates with at least one of the following: the thickness of the solid coating, the speed of the motorized conveyance mechanism, or the rate of the deposition of the liquid coating solution.

30. The portable solar panel coating apparatus of claim 18, further comprising a humidity sensor coupled to the circuitry, wherein the humidity sensor reads a relative humidity that correlates with at least one of the following: the thickness of the solid coating, the speed of the motorized conveyance mechanism, or the rate of the deposition of the liquid coating solution.

31. The portable solar panel coating apparatus of claim 18, further comprising a human-machine interface coupled to the circuitry, wherein the human-machine interface comprises one of a touch screen or a key pad.

32. The portable solar panel coating apparatus of claim 18, further comprising a wireless interface coupled to the circuitry, wherein the wireless interface is to send and receive data wirelessly.

33. The portable solar panel coating apparatus of claim 18, wherein said performance enhancement coating is a multi-functional coating having at least one function selected from the group consisting of an anti-reflection function, a wave-length shifting function, an optical filtering function, a low-E function, an anti-soiling function, a self-cleaning function, or an energy transmission-enhancement function.

34. The portable solar panel coating apparatus of claim 18, wherein the one or more pumps is to be in fluidic communication with the one or more of the coating applicator mechanisms through one or more tubes or channels that extend from a fluid reservoir.

35. The portable solar panel coating apparatus of claim 18, wherein positioning the portable solar panel coating apparatus or a portion thereof on or near at least one side of the dosing platform causes the deformable porous structure to come in contact with the dosing platform.

36. The portable solar panel coating apparatus of claim 35, wherein the dosing platform provides the liquid coating solution to the deformable porous structure.

37. The portable solar panel coating apparatus of claim 18, wherein the liquid performance enhancement coating material dispensed by the portable solar panel coating apparatus onto the one or more of the solar panels is dispensed by at least one or more of the following: a spray head, a roller, a slot, a brush, a doctor blade, a wiper, a drawbar, a sponge, a piece of foam, or a porous textile layer.

38. The portable solar panel coating apparatus of claim 18, wherein the liquid performance enhancement coating material dispensed by the portable solar panel coating apparatus onto the one or more of the solar panels is dispensed from the at least one liquid conduit disposed on a first side of the dosing platform by at least one or more of the following: a spray head, a roller, a slot, a brush, a doctor blade, a wiper, a drawbar, a sponge, a piece of foam, or a porous textile layer.

* * * * *